US007011986B2

(12) United States Patent
Daeche et al.

(10) Patent No.: US 7,011,986 B2
(45) Date of Patent: Mar. 14, 2006

(54) METHOD FOR MANUFACTURING A HOUSING FOR A CHIP WITH A MICROMECHANICAL STRUCTURE

(75) Inventors: Frank Daeche, Munich (DE); Hans-Joerg Timme, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/962,979

(22) Filed: Oct. 12, 2004

(65) Prior Publication Data

US 2005/0106785 A1 May 19, 2005

Related U.S. Application Data

(63) Continuation of application No. PCT/EP03/02756, filed on Mar. 17, 2003.

(30) Foreign Application Priority Data

Apr. 12, 2002 (DE) ................................ 102 16 267

(51) Int. Cl.
*H01L 21/44* (2006.01)

(52) U.S. Cl. ....................... 438/106; 438/456; 438/125

(58) Field of Classification Search ................ 438/106, 438/456, 125
See application file for complete search history.

(56) References Cited

U.S. PATENT DOCUMENTS

| | | | | |
|---|---|---|---|---|
| 5,561,085 | A | 10/1996 | Gorowitz et al. | |
| 5,610,431 | A * | 3/1997 | Martin | 257/415 |
| 5,729,185 | A | 3/1998 | Johnson et al. | |
| 5,757,072 | A | 5/1998 | Gorowitz et al. | |
| 5,920,142 | A | 7/1999 | Onishi et al. | |
| 6,154,940 | A | 12/2000 | Onishi et al. | |
| 6,338,284 | B1 * | 1/2002 | Najafi et al. | 73/866.1 |
| 6,559,487 | B1 | 5/2003 | Kang et al. | |
| 6,767,757 | B1 | 7/2004 | Kang et al. | |
| 6,808,954 | B1 * | 10/2004 | Ma et al. | 438/51 |
| 2001/0001293 | A1 | 5/2001 | Gotoh, et al. | |
| 2001/0011857 | A1 | 8/2001 | Morishima | |
| 2003/0012884 | A1 | 1/2003 | Pahl, et al. | |
| 2003/0132493 | A1 | 7/2003 | Kang, et al. | |

FOREIGN PATENT DOCUMENTS

| | | | |
|---|---|---|---|
| DE | 100 06 446 | A1 | 8/2001 |
| EP | 0 718 885 | A2 | 6/1996 |
| EP | 0 794 616 | A2 | 9/1997 |
| EP | 0 805 552 | A2 | 11/1997 |
| EP | 1 096 259 | A1 | 5/2001 |
| JP | 06-005608 | | 1/1994 |
| JP | 2001244785 | A | 9/2001 |

OTHER PUBLICATIONS

Tilmans, H.A.C., et al., “The Indent Reflow Sealing (IRS) Technique —A Method for the Fabrication of Sealed Cavities for MEMS Devices” Journal of Microelectromechanical Systems, 2000 IEEE, vol. 9, No. 2, Jun. 2000, pp. 206-217.

* cited by examiner

*Primary Examiner*—Luan Thai
(74) *Attorney, Agent, or Firm*—Slater & Matsil, L.L.P.

(57) ABSTRACT

In a housing manufacturing method a base is provided with first contact elements with a photolithographically patternable layer that is patterned for exposing the contact elements. A chip with a micromechanical structure lying between second contact elements at the chip is provided with a photolithographically patternable layer which is patterned in order to provide a recess in the area of the micromechanical structure and in the area of the second contact elements. After joining the base and the chip the base is removed by etching.

20 Claims, 2 Drawing Sheets

METHOD FOR MANUFACTURING A HOUSING FOR A CHIP WITH A MICROMECHANICAL STRUCTURE

CROSS-REFERENCE TO RELATED APPLICATIONS

This application is a continuation of co-pending International Application No. PCT/EP03/02756, filed Mar. 17, 2003 which designated the United States and was not published in English, and which is based on German Application No. 102 16 267.0, filed Apr. 12, 2002, both of which applications are incorporated herein by reference.

BACKGROUND OF THE INVENTION

1. Field of the Invention

The present invention relates to a method for manufacturing a housing for a chip with a micromechanical structure.

2. Description of the Related Art

Chips with micromechanical structures or so-called micromechanical circuits, respectively, have an increasing share of the market for high-frequency switches and high-frequency filters. One of the main markets for such chips with micromechanical structures is the mobile radio market. A chip having a micromechanical structure which is also referred to as a micromechanical circuit is a semiconductor device wherein a micromechanical structure is implemented on its surface. For such circuits individual housing technologies are required, wherein the housing needs to determine a cavity around the micromechanical structure.

A conventional proceeding in the prior art for housing a chip with a micromechanical structure is to use ceramic housing elements with a cavity. These ceramic housing patterns are both too expensive and also too large for technological requirements resulting today. Typical dimensions of such ceramic housings for a chip with a micromechanical structure are about 3 mm×3 mm×1.3 mm. These dimensions may not be further reduced with the conventional ceramic housing technologies.

SUMMARY OF THE INVENTION

Based on this prior art, it is the object of the present invention to provide a method for manufacturing a housing for a chip with a micromechanical structure which is no longer subject to the cost and size related restrictions of prior housing technologies.

According to a first aspect of the inventive method a first photolithographically patternable layer within a partial area of the main face of the base is applied and photolithographically patterned on a basis with first contact elements on a first main face in order to expose the first contact elements. A second photolithographically patternable layer is applied to the main face of a chip with a micromechanical structure which is arranged on the main face between second contact elements. By a suitable photolithographical patterning a recess surrounded by a wall is formed within the second layer, wherein the second contact elements are exposed. Then the base and the chip are joined such that the main face of the chip and the main face of the base are facing each other and that respective first and second contact elements are connected to each other. Finally, the base is removed in order to expose the first contact elements at the exposed main face of the first photolithographical layer.

According to a further aspect of the present invention, a method for manufacturing a housing for a chip with a micromechanical structure is provided which starts off with a basis with first contact elements and a plate element on a main face of the base. A chip with a micromechanical structure which is arranged at a main face of the chip between second contact elements is provided with a photolithographically patternable layer on at least one partial area of the main face of the chip. Then, a photolithographical patterning of this layer is performed for generating a recess surrounded by a wall in the layer in the area of the micromechanical structure and for exposing the second contact elements. Subsequently, the base and the chip are joined such that the main face of the chip and the main face of the base are facing each other, the plate element abuts the wall and covers the recess and respective first and second contact elements are connected to each other. Subsequently, the base for exposing the first contact elements is removed. In this variant of the inventive method, the plate element, preferably formed by a large-area metal island on the base, may form the later "lid" of the recess in the photolithographically patterned layer, so that in this variant of the inventive method the photolithographically patterned layer on the base may be omitted, although it is also conceivable to cover the plate element with a photolithographically patternable layer by applying a photolithographically patternable layer on the base after providing the same with the first contact elements and the plate element, wherein the photolithographically patternable layer is then patterned in order to expose the contact elements of the base.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

Figure 1A:
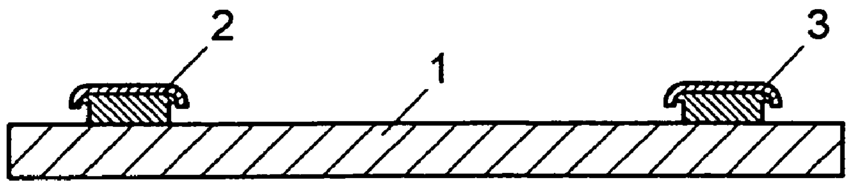
FIGS. 1*a* to 1*c* show a base of a housing in three method steps for manufacturing the housing.
Figure 1B:
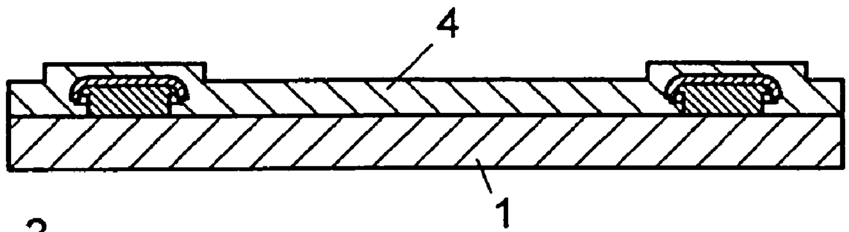

As it is shown in FIG. 1*a*, first of all a base 1 consisting of copper is provided on which metal islands 2, 3 are implemented. Metal islands implemented as nickel-plated islands on the copper base 1 are preferred, which are coated with a gold plating. The type of the arrangement of these islands 2, 3 and the size of these islands 2, 3 is selected so that they correspond to contact bumps on the bottom of a chip which are still to be discussed. As it is shown in FIG. 1*b*, in a first method step a first photosensitive epoxy layer 4 is applied to the main face of the base 1 on which the metal islands 2, 3 are arranged.

Figure 1C:
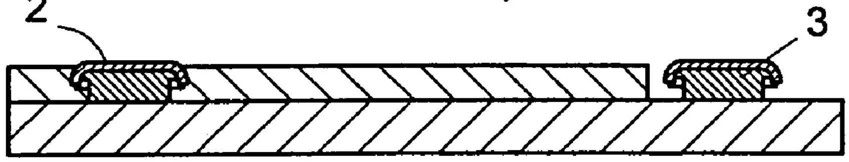

As it is shown in FIG. 1*c*, in the next method step a photolithographical patterning of the first photosensitive epoxy layer 4 is performed in order to expose the metal islands 2, 3 at least on its surface. In this photolithography at least those areas of the photosensitive first epoxy layer 4 are to be illuminated, so that they remain after the processing, which are opposite the "active" area around the micromechanical structure of the chip after assembling the housing.

The method steps which are now to be explained with reference to FIGS. 2*a* to 2*d* are performed on chip 5. The term "chip" within the scope of the present application is any semiconductor device on which a micromechanical structure is implemented.

Figure 2A:
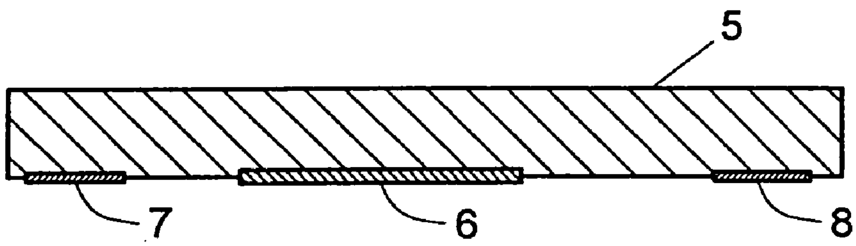
FIGS. 2*a* to 2*d* show a chip in four method steps for manufacturing the housing.

As it is shown in FIG. 2*a*, the chip comprises a micromechanical structure 6 on its bottom side, which is electrically connected to contact bumps 7, 8 also arranged on the bottom side of the chip 5. If the provided chip comprising the micromechanical structure does not yet comprise these contact bumps 7, 8, a metallization method step is required for generating the underbumps 7, 8 ("underbump metallization").

Figure 2B:
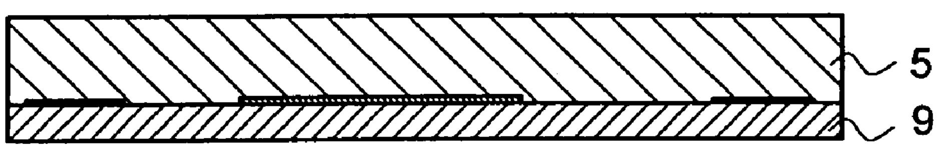

In the method step shown in FIG. 2*b* a coating on the surface of the chip 5 (or the semiconductor wafer 5, respectively) is performed by a spin coating using a photosensitive epoxy layer. This spin coating may be repeated several times for building up a desired layer thickness which determines the thickness of the gravity to be realized later, until a second photosensitive epoxy layer 9 of the desired thickness has been built up.

Figure 2C:
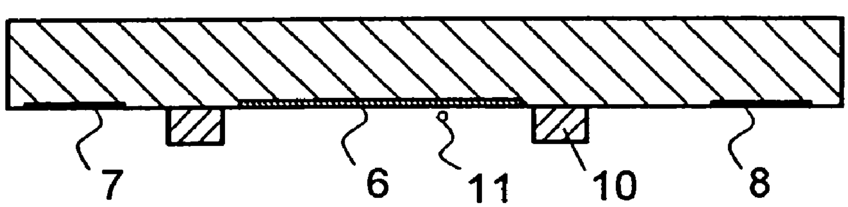
Figure 2D:
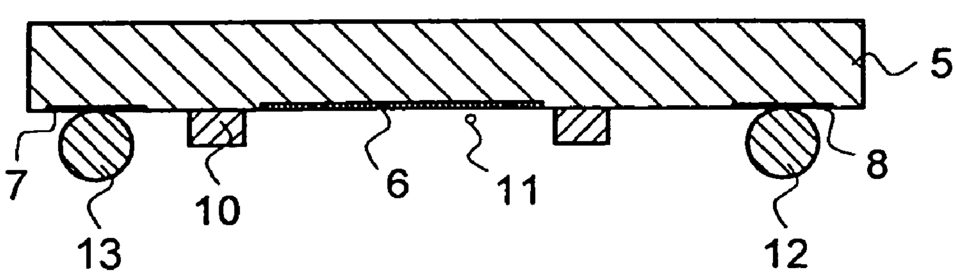

As it is illustrated in FIG. 2*c*, now a photolithographical patterning of the second epoxy layer 9 is performed for generating a recess 11 surrounded by a wall 10 and for exposing the contact bumps 7, 8. The wall 10 encloses the "active area" around the micromechanical structure 6. In the method step illustrated in FIG. 2*d* solder balls 12, 13 are applied to the contact bumps 7, 8.

Figure 3A:
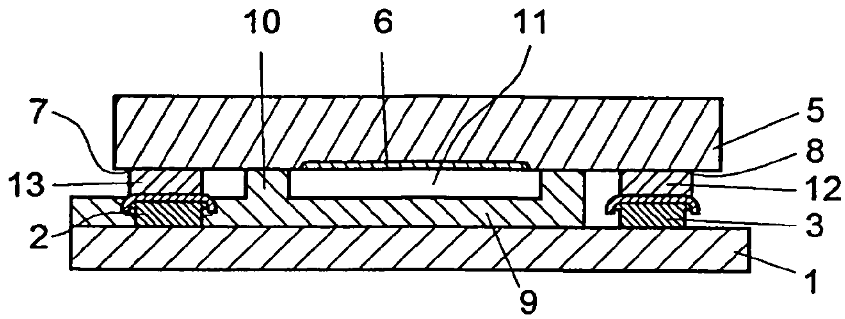
FIGS. 3*a* to 3*c* show the base joined to a housing with the chip in three further method steps for manufacturing the housing.

As it is shown in FIG. 3*a*, the base 1 and the chip 5 are then joined such that their mentioned main faces are facing each other and that the respectively opposing metal islands 2, 3 and contact bumps 7, 8 are connected to each other via the solder balls 12, 13 by soldering or a thermal compression process.

In the first implementation of the inventive method discussed here, the wall 10 together with the second epoxy layer 9 forms the recess 11 in the form of a closed cavity which surrounds the micromechanical structure 6. In the following method step shown in FIG. 3*b*, the hitherto generated pattern is completed with a cover layer 14. This method step preferably takes place with an increased temperature level, wherein a plastic material forming the cover layer 14 is liquefied. During the final decreasing of the temperature level a contraction of the contact patterns results, whereby the wall 10 is firmly pressed to the opposing second epoxy layer 9.

In the final method step shown in FIG. 3*c* the base 1 is removed by a copper etching process, whereby the metal islands 2, 3 are made accessible for a later contacting at the exposed main face of the first layer 4.

Figure 3B:
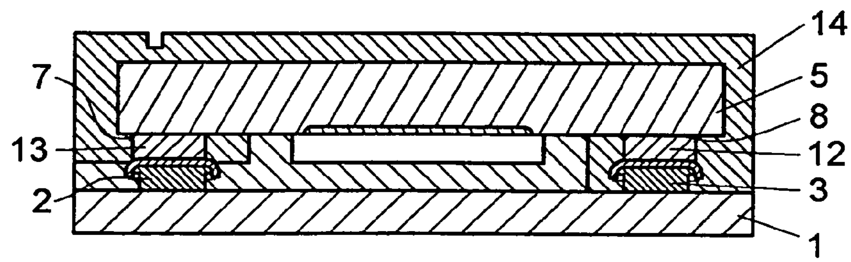
Figure 3C:
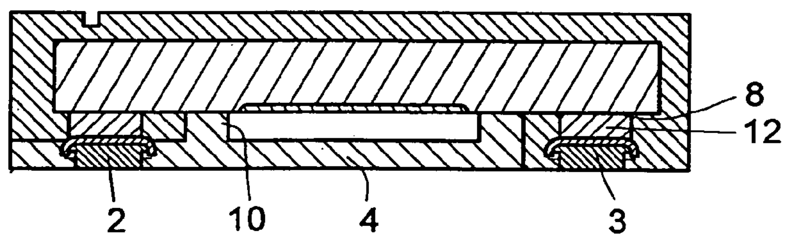

As it is explained in FIGS. 3*a* to 3*c*, it is preferred that the metal islands 2, 3 comprise an exterior outline with projections and retreats by which an improved anchoring on the first epoxy layer 4 against the metal islands 2, 3 is achieved in order to prevent a slipping off of the first epoxy layer 4 of the metal islands 2, 3 during the temperature decrease after completion of the method step shown in FIG. 3*b*.

After performing the copper etch step described with reference to FIG. 3*c*, preferably a gold plating of the exposed contact areas of the metal islands 2, 3 at the now exposed main face of the first epoxy layer 4 is performed.

In the method described above with reference to FIGS. 1 to 3, the first epoxy layer 4 forms the "lid" of the recess 11.

Figure 4A:
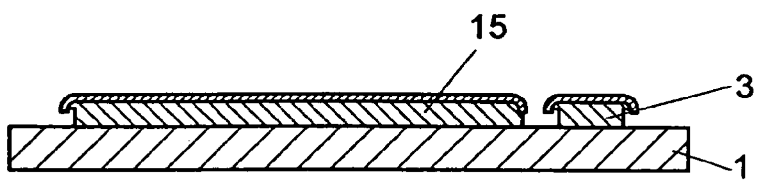
FIGS. 4*a* to 4*c* show illustrations of the base or the housing, respectively, with modified embodiments of the method.
Figure 4B:
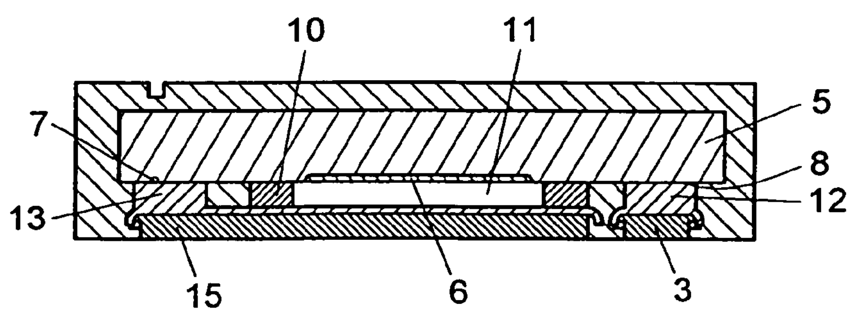

In the embodiment of the inventive method to be described now with reference to FIGS. 4*a* and 4*b*, the recess 11 is not covered by the first epoxy layer 4 but by a plate element preferably consisting of metal. Those parts of the inventive method which remain unchanged with regard to the above-mentioned method, are designated by the same reference numerals, so that a renewed description of these parts may be omitted.

As it is shown in FIG. 4*a*, this modification of the inventive method starts with providing a base 1 which, apart from the metal island 3 serving as a contact, includes a plate element 15 formed by a large-area metal island, whose dimensions and position are selected so that the plate element 15 covers the active areas of the chip 5 including the micromechanical structure 6 and thus the recess 11 within the wall 10. Simultaneously, the plate element 15 may be used for an electrical contacting, as it is further illustrated in more detail with reference to FIG. 4*b*.

In FIG. 4*b* the assembled state of the preprocessed chip 5 with the base 1 are shown after the method steps according to FIGS. 2*a* to 2*d*. As it is illustrated here, the preprocessed components, i.e., the chip 5 and the base 1, are joined such that the main face of the chip 5 on which the micromechanical structure 6 and the contact bumps 7, 8 are arranged are opposite to the main face of the base 1 which includes the metal island 3 and the plate element 15, so that the metal island 3 is connected to the contact bump 8 via the solder connection 12 and the contact bump 7 is connected to the plate element 15.

With this implementation of the inventive method it is possible, however not absolutely necessary, to spin a photolithographically patternable epoxy layer onto the base shown in FIG. 4*a* before joining the base and the chip and to pattern the same so that the plate element 15 and the metal island 3 are exposed. After joining the mentioned parts according to FIG. 4*b* the overall pattern is again cast with plastic, the copper base 1 is etched off and a gold plating of the then exposed contact faces of the metal island 3 and the plate element 15 is performed.

Figure 4C:
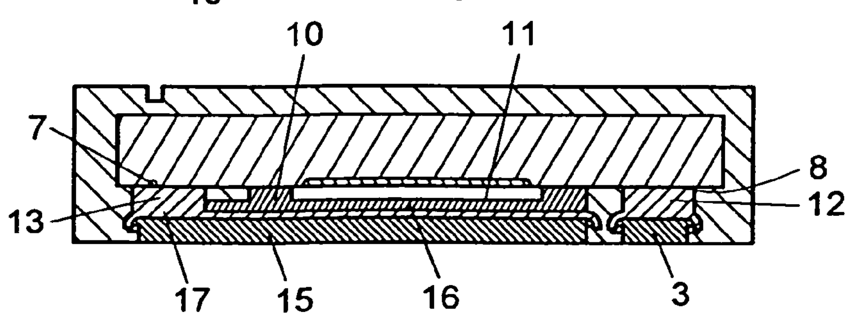

One modification of the implementation of the inventive method described above with reference to FIGS. 4*a* and 4*b* which leads to the pattern of the housing shown in FIG. 4*c* is achieved by an additional method step after providing the base 1 with the plate element 15 and the metal island 3 by applying a photolithographically patternable epoxy layer 16 onto the base by spinning which covers the plate element 15, whereupon this epoxy layer is patterned such that only the metal island 3 and a contact area 17 of the plate element 15 are exposed while the plate element 15 remains covered in the area of the recess 11 and the wall 10 of the epoxy layer 16.

In the above-described method a base consisting of copper is assumed. As the base only represents a sacrificial pattern, any other easily removable material instead of copper, preferably a material removable by etching, may be used.

For the metal islands and contact bumps, instead of the use of nickel as a base material with gold plating as a coating, any other contact materials may be used.

In the described preferred embodiments, photolithographically patternable layers consist of a photosensitive epoxy material which is even removed or remains by illuminating or not illuminating, respectively, of parts of the epoxy material. At the same time it is possible, however, to form the photolithographically patternable layers by any etchable materials covered by photo masks.

In deviation of the above-described preferred embodiments, a sheathing of the manufactured housing pattern using vacuum screen printing or reprinting may be performed.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method for manufacturing a housing for a chip having a micromechanical structure, comprising:

providing a base having first contact elements on a main face of the base;

applying a first photolithographically patternable layer onto at least a partial area of the main face of the base;

photolithographical patterning of the first layer for exposing the first contact elements;

providing a chip having a micromechanical structure arranged on a main face of the chip between second contact elements;

applying a second photolithographically patternable layer onto at least a partial area of the main face of the chip;

photolithographical patterning of the second photolithographically patternable layer for generating a recess surrounded by a wall in the second photolithographically patternable layer in the area of the micromechanical structure and for exposing the second contact elements;

joining the base and the chip such that the main face of the chip and the main face of the base are facing each other and that the respective first and second contact elements are connected to each other; and removing the base for exposing the first contact elements at the exposed main face of the first photolithographically patternable layer.

2. The method of claim 1, wherein the first contact elements are metal islands.

3. The method of claim 2, wherein the metal islands comprise gold plated nickel islands.

4. The method of claim 1, comprising the method step of applying solder balls onto the first contact elements before the step of joining.

5. The method of claim 1, wherein the base comprises a metal.

6. The method of claim 5, wherein the base comprises copper.

7. The method of claim 5, wherein the step of removing the base includes etching away the base.

8. The method of claim 1, wherein the photolithographically patternable layers comprise a photosensitive epoxy resin.

9. The method of claim 1, wherein the step of photolithographically patterning the photolithographically patternable layer applied onto the chip is performed such that in addition to the wall partial areas of the layer remain which surround the second contact elements.

10. The method of claim 9, wherein the partial areas of the layer surrounding the second contact elements have a reduced thickness compared to the layer thickness of the wall.

11. A method for manufacturing a housing for a chip having a micromechanical structure, comprising:

providing a base having first contact elements and a plate element on a main face of the base;

providing a chip having a micromechanical structure arranged on a main face of the chip between second contact elements;

applying a photolithographically patternable layer on at least one partial area of the main face of the chip;

photolithographical patterning of the photolithographically patternable layer for generating a recess surrounded by a wall within the photolithographically patternable layer in the area of the micromechanical structure for exposing the second contact elements;

joining the base and the chip such that the main face of the chip and the main face of the base are facing each other, the plate element abuts on the wall and covers the recess and respective first and second contact elements are connected to each other; and removing the base for exposing the first contact elements.

12. The method of claim 11, wherein the first contact elements are metal islands.

13. The method of claim 12, wherein the metal islands comprise gold plated nickel islands.

14. The method of claim 11, further comprising the method step of applying solder balls onto the first contact elements before the step of joining.

15. The method of claim 11, wherein the base comprises a metal.

16. The method of claim 15, wherein the base comprises copper.

17. The method of claim 15, wherein the step of removing the base includes etching away the base.

18. The method of claim 11, wherein the photolithographically patternable layer comprises a photosensitive epoxy resin.

19. The method of claim 11, wherein the step of photolithographically patterning the photolithographically patternable layer applied onto the chip is performed such that in addition to the wall partial areas of the layer remain which surround the second contact elements.

20. The method of claim 19, wherein the partial areas of the layer surrounding the second contact elements have a reduced thickness compared to the layer thickness of the wall.

* * * * *